(12) United States Patent
Hashimoto

(10) Patent No.: US 7,464,941 B2
(45) Date of Patent: *Dec. 16, 2008

(54) SEALING MECHANISM FOR SEALING A VACUUM CHAMBER

(75) Inventor: Akio Hashimoto, Tsu (JP)

(73) Assignee: Teijin Seiki Co., Ltd., Osaka (JP)

( * ) Notice: Subject to any disclaimer, the term of this patent is extended or adjusted under 35 U.S.C. 154(b) by 511 days.

This patent is subject to a terminal disclaimer.

(21) Appl. No.: 11/286,410

(22) Filed: Nov. 25, 2005

(65) Prior Publication Data

US 2006/0103076 A1    May 18, 2006

Related U.S. Application Data

(60) Continuation of application No. 10/732,466, filed on Dec. 11, 2003, now Pat. No. 7,246,800, which is a continuation of application No. 09/919,840, filed on Aug. 2, 2001, now Pat. No. 6,688,604, which is a division of application No. 09/417,308, filed on Oct. 13, 1999, now Pat. No. 6,296,255.

(30) Foreign Application Priority Data

Oct. 26, 1998   (JP) ................... 10-304441

(51) Int. Cl.
    *F16J 15/00* (2006.01)
(52) U.S. Cl. ............... 277/558; 277/554; 277/913
(58) Field of Classification Search ........ 277/365, 277/358, 566, 913, 553–554, 926–928, 918, 277/558; 901/19; 74/490.01
    See application file for complete search history.

(56) References Cited

U.S. PATENT DOCUMENTS

| 3,114,561 A | 12/1963 | Creath et al. |
| 3,854,732 A | 12/1974 | Franz et al. |
| 4,093,241 A * | 6/1978 | Muntjanoff et al. ......... 277/550 |
| 4,133,542 A | 1/1979 | Janian et al. |
| 4,407,518 A | 10/1983 | Moskowitz et al. |
| 4,502,700 A | 3/1985 | Gowda et al. |
| 4,508,356 A | 4/1985 | Janian |
| 4,545,587 A | 10/1985 | Higgins |
| 4,575,102 A | 3/1986 | Raj et al. |
| 4,585,238 A | 4/1986 | Nicholson |
| 4,585,239 A | 4/1986 | Nicholson |
| 4,603,609 A | 8/1986 | Takatoshi |

(Continued)

FOREIGN PATENT DOCUMENTS

DE          669500         4/1952

*Primary Examiner*—William L. Miller
(74) *Attorney, Agent, or Firm*—Venable LLP; Andrew C. Aitken

(57) ABSTRACT

A sealing mechanism comprises a support member forming part of the semiconductor producing apparatus which has a vacuum chamber, a rotation shaft rotatably received in the support member, and at least three seal rings axially spaced apart from each other between the support member and the rotation shaft to form a first fluid chamber close to the atmosphere and a second fluid chamber close to the vacuum chamber. The first fluid chamber is vacuumized to have a first pressure, and the second fluid chamber is also vacuumized to have a second pressure which is lower than the first pressure. The first and second fluid chambers work together to enhance the sealing performance of the sealing mechanism.

13 Claims, 9 Drawing Sheets

U.S. PATENT DOCUMENTS

| | | |
|---|---|---|
| 4,749,283 A | 6/1988 | Yokomatsu et al. |
| 4,984,811 A | 1/1991 | Kuwabara et al. |
| 5,137,116 A | 8/1992 | Von Bergen et al. |
| 5,163,692 A | 11/1992 | Schofield et al. |
| 5,643,026 A | 7/1997 | Pietsch et al. |
| 5,683,278 A | 11/1997 | Pietsch et al. |
| 6,039,303 A | 3/2000 | Danielson et al. |
| 6,091,175 A | 7/2000 | Kinsinger |
| 6,296,255 B1 | 10/2001 | Hashimoto |
| 6,481,720 B1 | 11/2002 | Yoshida et al. |

* cited by examiner

SEALING MECHANISM FOR SEALING A VACUUM CHAMBER

CROSS REFERENCE TO RELATED APPLICATIONS

This application is a continuation of application Ser. No. 10/732,466, filed Dec. 11, 2003, now U.S. Pat. No. 7,246,800, which is a continuation of application Ser. No. 09/919,840, filed Aug. 2, 2001, now U.S. Pat. No. 6,688,604, which is a division of application Ser. No. 09/417,308, filed Oct. 13, 1999, now U.S. Pat. No. 6,296,255, the disclosure of which is incorporated herein by reference. The applicant claims the benefit of the filing date of each of these cases.

BACKGROUND OF THE INVENTION

1. Field of the Invention

The present invention relates to a sealing mechanism for sealing a vacuum chamber, and more particularly to a sealing mechanism for sealing a vacuum chamber formed in the semiconductor producing apparatus to be shut down from its exterior.

2. Description of the Related Art

In general, the semiconductor producing apparatus of this kind is maintained vacuumized and highly pure in air for producing such products because dusts and other foreign materials are detrimental to wafers and other semiconductor materials in the process of producing the semiconductor producing apparatus. The semiconductor producing apparatus is usually required to be operated by some kinds of driving mechanism such as a manipulator driven by a drive shaft to handle semiconductor devices, LCD base plates and other objects to be treated. The drive shaft has axial portions extending inside and outside of a vacuum chamber formed in the semiconductor producing apparatus. This means that the gaps between the axial portions of the drive shaft and the other parts around the axial portions of the drive shaft are required to be tightly sealed to have the vacuum chamber maintained at a constant vacuum level.

In recent years, meanwhile, the process of producing semiconductors has remarkably been progressed to obtain more excellent performance, higher density and integration for the products. The process, however, tends to have a relatively low productivity as compared with other industrial products. This is due to the fact that dusts and foreign materials detrimental to wafers and other semiconductor materials are apt to enter the vacuum chamber of the semiconductor producing apparatus. The dusts and foreign materials which may cause inferior products are each made of a particle generally larger than the thickness of an insulator layer to be turned into a semiconductor. At the present time, strenuous efforts continue to be made for reducing to as a lowest level as possible such dusts and foreign materials each having a size larger than the thickness of the insulator layer. These strenuous efforts have not yet become successful.

The typical conventional semiconductor producing apparatus is partly shown in FIG. 15 and comprises a manipulator 210 drivably installed in the vacuum chamber 261 of the semiconductor producing apparatus which is vacuumized through an aperture 201 formed in the wall of the semiconductor producing apparatus.

The manipulator 210 is shown in FIG. 16 as having a drive shaft 250 which is rotatably supported on a support member 240. The wall portion 202 of the semiconductor producing apparatus is formed with a hole 202a having the support member 240 fixedly received therein. The drive shaft 250 shown in FIG. 15 has a forward end portion extending in the vacuum chamber 261 to pivotally support first and second robot arms 213 and 214, and a handling member 215 operatively coupled with the first and second robot arms 213 and 214 so that the handling member 215 can be operated to handle semiconductor devices, LCD base plates and other objects to be treated. Also, the drive shaft 250 has a rear end portion extending in the atmosphere 260 and drivably connected with driving means constituted by an electric motor and reduction gears which are not shown in the drawings.

The drive shaft 250 is shown in FIG. 16 as comprising a first cylindrical shaft 230 rotatably received in the support member 240 through bearings 216a and a second cylindrical shaft 220 rotatably received in the first cylindrical shaft 230 through bearings 216b.

One typical example of the conventional sealing mechanisms is also shown in FIG. 16 to comprise a first group 218 of magnetic fluid seals axially arranged between the support member 240 and the first cylindrical shaft 230, and a second group 219 of magnetic fluid seals axially arranged between the first and second cylindrical shafts 230 and 220. The two groups 218 and 219 of magnetic fluid seals can function to maintain the vacuum chamber 261 in a hermetically sealed state, resulting in the fact that dusts and foreign materials, i.e., fine particles generated from frictional contacts between elements or parts outside of the vacuum chamber 261 can be prevented from entering the vacuum chamber 261.

The conventional sealing mechanism mentioned in the above is of a performance having a resistant pressure of 0.2 atmospheric pressure for each of the magnetic fluid seals 218 and 219. From this reason, the conventional sealing mechanism is required to comprise a plurality of magnetic fluid seals 218 axially disposed in a series between the support member 240 and the first cylindrical shaft 230, and a plurality of magnetic fluid seals 219 also axially disposed in a series between the first and second cylindrical shafts 230 and 220 as described in the above.

The above known sealing mechanism, however, encounters such a problem that the dusts and foreign materials cannot fully be prevented from entering the vacuum chamber and that the vacuum chamber thus cannot be maintained at a constant vacuum level.

It is, therefore, an object of the present invention to provide a sealing mechanism suitable for sealing a vacuum chamber formed in the semiconductor producing apparatus.

It is another object of the present invention to provide a sealing mechanism having an excellent sealing performance to seal a vacuum chamber formed in the semiconductor producing apparatus.

SUMMARY OF THE INVENTION

According to the first aspect of the present invention there is provided a sealing mechanism for sealing a vacuum chamber formed in the semiconductor producing apparatus, comprising: a rotation shaft driven to be rotatable around its own axis and having an outer surface in the form of a cylindrical shape; a support member intervening between the vacuum chamber and the atmosphere and rotatably supporting the rotation shaft to have the rotation shaft received therein, the support member having an inner surface in the form of a cylindrical hollow shape and first and second axial ends respectively extending in the atmosphere and the vacuum chamber, the inner surface of the support member being larger in diameter than the outer surface of the rotation shaft, the support member being formed with a first fluid passageway having a first end and a second end and a second fluid passageway having a first end and a second end open toward the vacuum chamber; first and second seal rings positioned between the rotation shaft and the support member in axially spaced-apart relationship with each other to hermetically seal the gap between the rotation shaft and the support member under the state that the first seal ring is located in the neighborhood of the first axial end of the support member and remote from the second axial end of the support member and that the second seal ring is located in the neighborhood of the second axial end of the support member and remote from the first axial end of the support member, the rotation shaft, the support member, and the first and second seal rings collectively forming a first fluid chamber held in communication with the first fluid passageway through the first end of the first fluid passageway; an air sucking unit having a port held in communication with the second end of the first fluid passageway to maintain the pressure of the first fluid passageway at a level between the atmospheric pressure and the inner pressure of the vacuum chamber; a third seal ring positioned between the rotation shaft and the support member in axially spaced-apart relationship with the second seal ring between the second seal ring and the extension plane radially inwardly extending and flush with the second axial end of the support member to hermetically seal the gap between the rotation shaft and the support member, the rotation shaft, the support member, and the second and third seal rings collectively forming a second fluid chamber held in communication with the second fluid passageway through the first end of the second fluid passageway; and a fluid filter disposed on the portion of the support member exposed to the vacuum chamber to cover the second end of the second fluid passageway.

According to the second aspect of the present invention there is provided a sealing mechanism in which the support member is formed with an additional first fluid passageway and an additional second fluid passageway.

According to the third aspect of the present invention there is provided a sealing mechanism for sealing a vacuum chamber formed in the semiconductor producing apparatus, comprising: a first rotation shaft driven to be rotatable around its own axis and having an outer surface in the form of a cylindrical shape; a second rotation shaft driven to be rotatable around its own axis and rotatably receiving therein the first rotation shaft, the second rotation shaft having an inner surface in the form of a cylindrical hollow shape, first and second axial ends respectively extending in the atmosphere and the vacuum chamber, and an outer surface in the form of a cylindrical shape, the inner surface of the second rotation shaft being larger in diameter than the outer surface of the first rotation shaft, the second rotation shaft being formed with a first fluid passageway having first and second ends respectively open at the inner and outer surface of the second rotation shaft and a second fluid passageway having first and second ends respectively open at the inner and outer surface of the second rotation shaft; a support member intervening between the vacuum chamber and the atmosphere and rotatably supporting the second rotation shaft to have the second rotation shaft received therein, the support member having an inner surface in the form of a cylindrical hollow shape and first and second axial ends respectively extending in the atmosphere and the vacuum chamber, the inner surface of the support member being larger in diameter than the outer surface of the second rotation shaft, the support member being formed with a third fluid passageway having a first end and a second end and a fourth fluid passageway having a first end and a second end open toward the vacuum chamber; first and second seal rings positioned between the first and second rotation shafts in axially spaced-apart relationship with each other to hermetically seal the gap between the first and second rotation shafts under the state that the first seal ring is located in the neighborhood of the first axial end of the second rotation shaft and remote from the second axial end of the second rotation shaft and that the second seal ring is located in the neighborhood of the second axial end of the second rotation shaft and remote from the first axial end of the second rotation shaft, the first and second rotation shafts and the first and second seal rings collectively forming a first fluid chamber held in communication with the first fluid passageway through the first end of the first fluid passageway; a third seal ring positioned between the first and second rotation shafts in axially spaced-apart relationship with the second seal ring between the second seal ring and extension plane radially inwardly extending and flush with the second axial end of the second rotation shaft to hermetically seal the gap between first and second rotation shafts, the first and second rotation shafts and the second and third seal rings collectively forming a second fluid chamber held in communication with the second fluid passageway through the first end of the second fluid passageway; fourth and fifth seal rings positioned between the second rotation shaft and the support member in axially spaced-apart relationship with each other to hermetically seal the gap between the second rotation shaft and the support member under the state that the fourth seal ring is located in the neighborhood of the first axial end of the support member and remote from the second axial end of the support member and that the fifth seal ring is located in the neighborhood of the second axial end of the support member and remote from the first axial end of the support member, the second rotation shaft, the support member, and the fourth and fifth seal rings collectively forming a third fluid chamber held in communication with the first fluid passageway through the second end of the first fluid passageway and the third fluid passageway through the first end of the third fluid passageway; an air sucking unit having a port held in communication with the second end of the third fluid passageway to maintain the pressure of the third fluid passageway at a level between the atmospheric pressure and the inner pressure of the vacuum chamber; a sixth seal ring positioned between the second rotation shaft and the support member in axially spaced-apart relationship with the fifth seal ring between the fifth seal ring and the extension plane radially inwardly extending and flush with the second axial end of the support member to hermetically seal the gap between the second rotation shaft and the support member, the second rotation shaft, the support member, and the fifth and sixth seal rings collectively forming a fourth fluid chamber held in communication with the second fluid passageway through the second end of the second fluid passageway and the fourth fluid passageway through the first end of the fourth fluid passageway; and a fluid filter disposed on the portion of the support member exposed to the vacuum chamber to cover the second end of the fourth fluid passageway.

According to the second aspect of the present invention there is provided a sealing mechanism in which the second rotation shaft is formed with an additional first fluid passageway and an additional second fluid passageway, and the support member is formed with an additional third fluid passageway and an additional fourth fluid passageway.

BRIEF DESCRIPTION OF THE DRAWINGS

The objects, features and advantages of the present invention will become apparent as the description proceeds when taken in conjunction with the accompanying drawings, in which.

DESCRIPTION OF THE PREFERRED EMBODIMENTS

Figure 1:
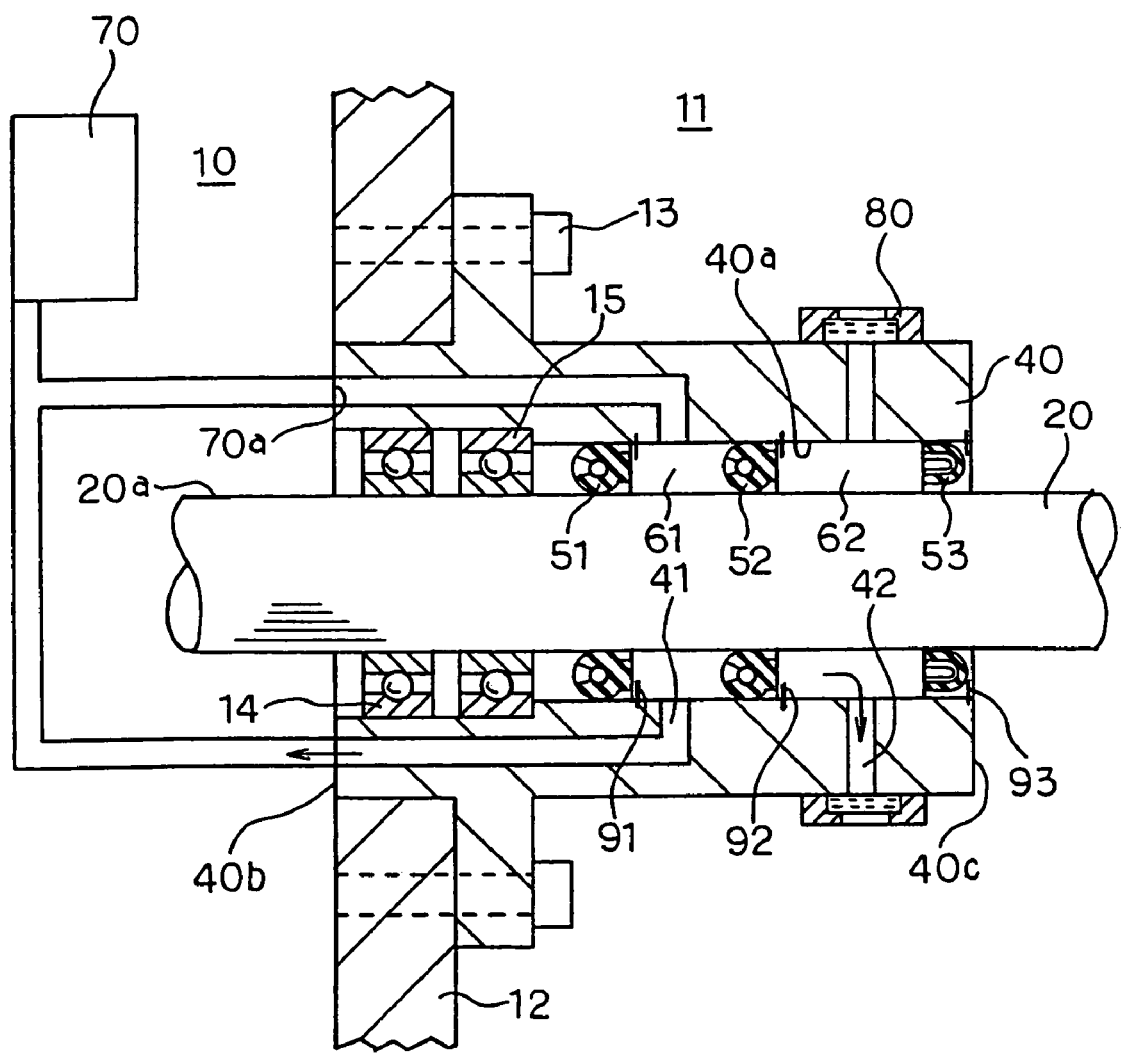
FIG. 1 is a fragmentary cross-sectional view of a first embodiment of the sealing mechanism according to the present invention.

Throughout the following detailed description, similar reference characters and numbers refer to similar elements in all figures of the drawings.

Figure 2:
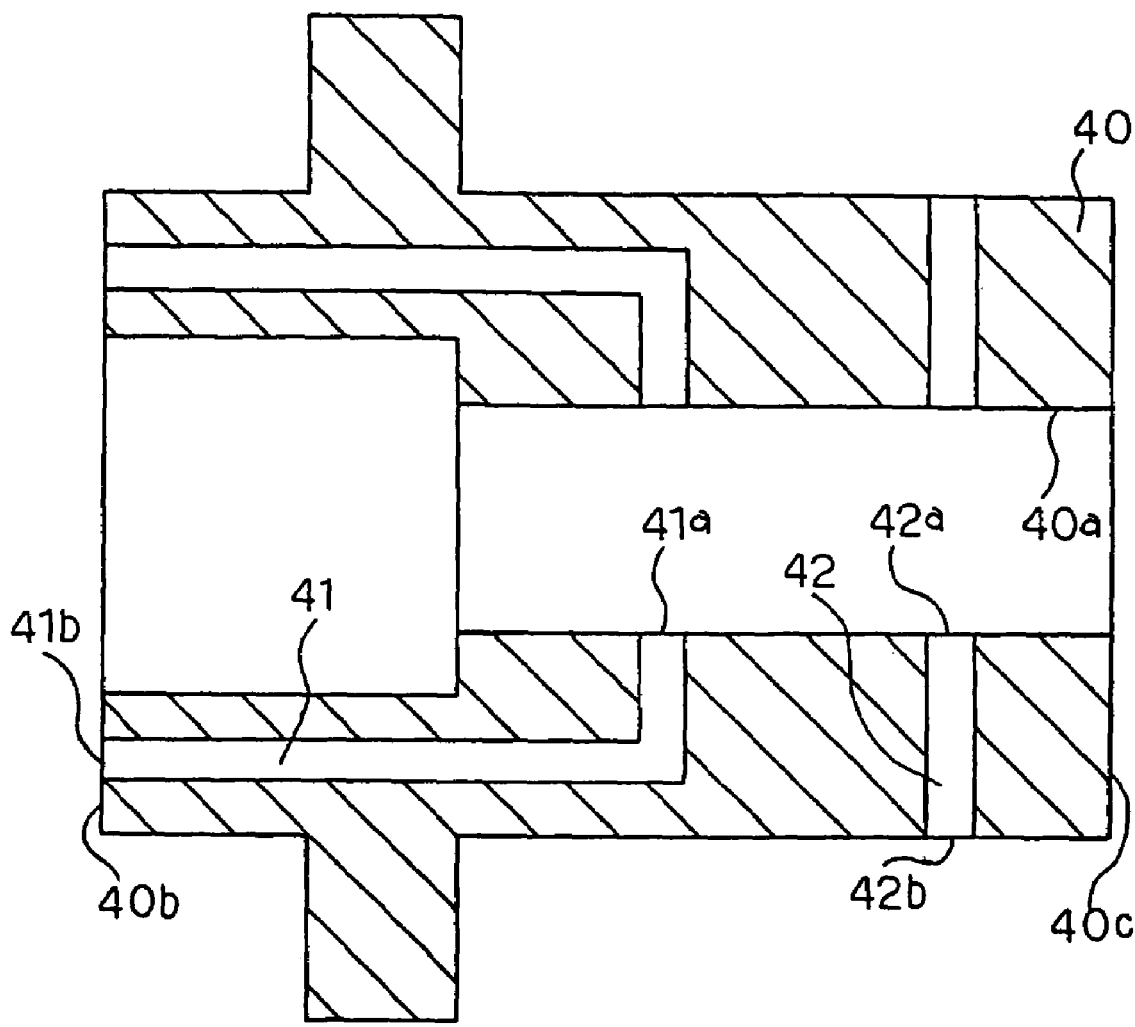
FIG. 2 is an enlarged cross-sectional view of a support member forming part of the sealing mechanism shown in FIG. 1.

Referring to FIGS. 1 and 2 of the drawings, there is shown a first preferred embodiment of the sealing mechanism according to the present invention. The sealing mechanism is shown in FIGS. 1 and 2 as comprising a rotation shaft 20 driven to be rotatable around its own axis and having an outer surface 20a in the form of a cylindrical shape.

The sealing mechanism further comprises a support member 40 intervening between the vacuum chamber 11 and the atmosphere 10 and rotatably supporting the rotation shaft 20 to have the rotation shaft 20 received therein through two axially spaced bearings 14 and 15. The support member 40 forms part of the semiconductor producing apparatus having the vacuum chamber 11. The semiconductor producing apparatus has a wall 12 partly shown in FIG. 1 and fixed to the support member 40 by bolts 13. The support member 40 has an inner surface 40a in the form of a cylindrical hollow shape and first and second axial ends 40b and 40c respectively extending in the atmosphere 10 and the vacuum chamber 11. The above-mentioned inner surface 40a of the support member 40 is larger in diameter than the outer surface 20a of the rotation shaft 20. The support member 40 is formed with a plurality of first fluid passageways 41 each having a first end 41a and a second end 41b and a plurality of second fluid passageways 42 each having a first end 42a and a second end 42b open toward the vacuum chamber 11.

While there have been described in the above about the fact that the support member 40 is formed with the plurality of first fluid passageways 41, the plurality of first fluid passageways 41 may be replaced by a single first fluid passageway 41, according to the present invention. Similarly, the plurality of second fluid passageways 42 may be replaced by a single second fluid passageway 42.

The sealing mechanism further comprises first and second seal rings 51 and 52 positioned between the rotation shaft 20 and the support member 40 in axially spaced-apart relationship with each other to hermetically seal the gap between the rotation shaft 20 and the support member 40 under the state that the first seal ring 51 is located in the neighborhood of the first axial end 40b of the support member 40 and remote from the second axial end 40c of the support member 40 and that the second seal ring 52 is located in the neighborhood of the second axial end 40c of the support member 40 and remote from the first axial end 40b of the support member 40. The rotation shaft 20, the support member 40, and the first and second seal rings 51 and 52 collectively form a first fluid chamber 61 held in communication with the first fluid passageway 41 through the first end 41a of the first fluid passageway 41.

The sealing mechanism further comprises an air sucking unit 70 having a port 70a held in communication with the second end 41b of the first fluid passageway 41 to maintain the pressure of the first fluid passageway 41 at a level between the atmospheric pressure and the inner pressure of the vacuum chamber 11.

According to the first aspect of the present invention there is provided a combination of a vacuum chamber formed in a semiconductor producing apparatus and a sealing mechanism for sealing the vacuum chamber, the sealing mechanism comprising: a rotation shaft driven to be rotatable around its own axis and having an outer surface in the form of a cylindrical shape; a support member intervening between the vacuum chamber and the atmosphere and rotatably supporting the rotation shaft to have the rotation shaft received therein, the support member having an inner surface in the form of a cylindrical hollow shape and first and second axial ends respectively extending in the atmosphere and the vacuum chamber, the inner surface of the support member being larger in diameter than the outer surface of the rotation shaft; a seal ring positioned between the rotation shaft and the support member to hermetically seal the gap between the rotation shaft and the support member; and a bearing positioned in the gap between the seal ring and the atmosphere, the rotation shaft being rotatably received in the support member through the bearing; the seal ring comprising an annular retaining member formed with an annular groove opening toward the atmosphere, and an annular spring member tightly received in the annular groove and retained by the annular retaining member to resiliently bias the annular retaining member to expand radially outwardly.

The sealing mechanism further comprises a third seal ring 53 positioned between the rotation shaft 20 and the support member 40 in axially spaced-apart relationship with the second seal ring 52 between the second seal ring 52 and the extension plane radially inwardly extending and flush with the second axial end 40c of the support member 40 to hermetically seal the gap between the rotation shaft 20 and the support member 40. The rotation shaft 20, the support member 40, and the second and third seal rings 52 and 53 collectively form a second fluid chamber 62 held in communication with the second fluid passageway 42 through the first end 42a of the second fluid passageway 42.

The sealing mechanism further comprises a fluid filter 80 disposed on the portion of the support member 40 exposed to the vacuum chamber 11 to cover the second end 42b of the second fluid passageway 42.

The sealing mechanism further comprises stop means for stopping the first to third seal rings 51, 52, and 53 from moving toward the vacuum chamber 11 with respect to the rotation shaft 20 and the support member 40. In this embodiment of the sealing mechanism, the stop means is constituted by first to third rings 91, 92, and 93 which are fastened selectively to the rotation shaft 20 and the support member 40 to respectively stop the first to third seal rings 51, 52, and 53 from moving toward the vacuum chamber 11.

To ensure that the frictions between the first to third seal rings 51, 52, and 53 and the rotation shaft 20 and between the first to third seal rings 51, 52, and 53 and the support member 40 are reduced to a minimum level, as a small level as possible, the outer surface 20a of the rotation shaft 20 and the inner surface 40a of the support member 40 are coated with a tetrafluoroethylene layer.

Figure 3:
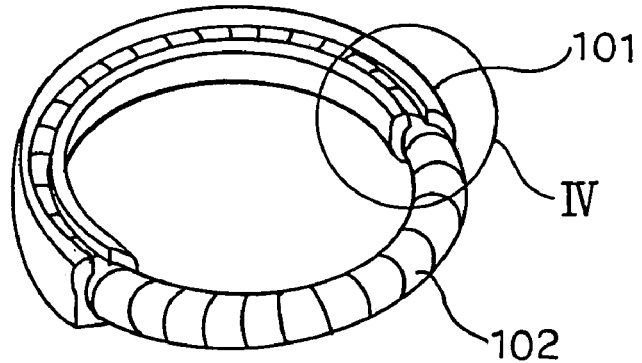
FIG. 3 is a fragmentary perspective view of each of first and second embodiments of the seal rings forming part of the sealing mechanism shown in FIGS. 1 and 12, the seal rings shown in FIG. 3 being positioned in axially parallel relationship with each other and remotest to the vacuum chamber formed in the semiconductor producing apparatus.
Figure 4:
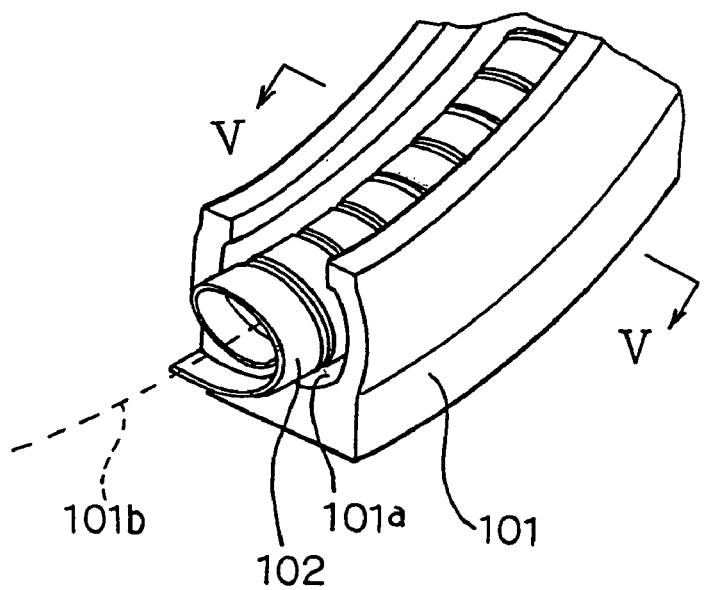
FIG. 4 is an enlarged fragmentary perspective view surrounded by the circle IV of FIG. 3.
Figure 5:
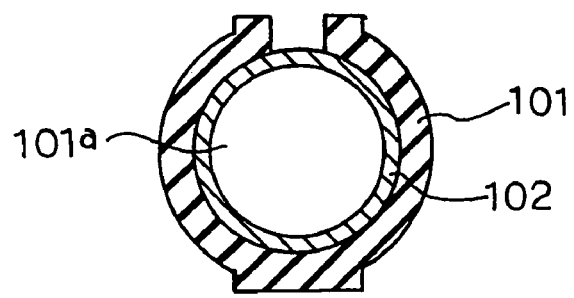
FIG. 5 is a cross-sectional view taken on the line V-V of FIG. 4.

As will be seen in FIGS. 3 to 5, each of the first and second seal rings 51 and 52 comprises an annular retaining member 101 formed with an annular groove 101a, and an annular spring member 102 tightly received in the annular groove 101a and retained by the annular retaining member 101 to resiliently bias the annular retaining member 101 to expand radially outwardly.

The annular retaining member 101 is made of a resilient material and the annular spring member 102 is made of a metal. The above-mentioned resilient material includes rubber and synthetic resin mainly containing a polyethylene. The annular spring member 102 is made of a strip in the form of a helical shape. The annular spring member 102 is covered by the annular retaining member 101. Each of the first and second seal rings 51 and 52 has a center axis 101b passing therethrough and is of a circular cross-section taken on the plane perpendicular to the center axis 101b.

Figure 6:
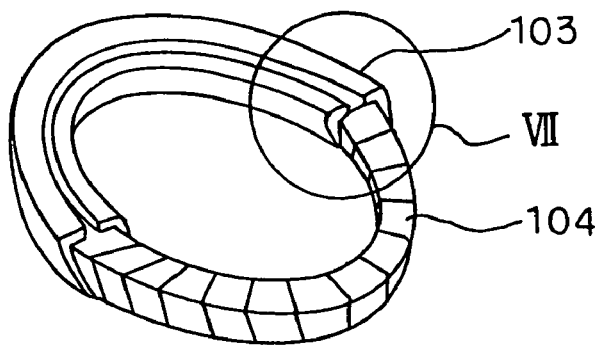
FIG. 6 is a fragmentary perspective view similar to FIG. 3 but showing each of other embodiments of the seal rings forming part of the sealing mechanism shown in FIGS. 1 and 12.
Figure 7:
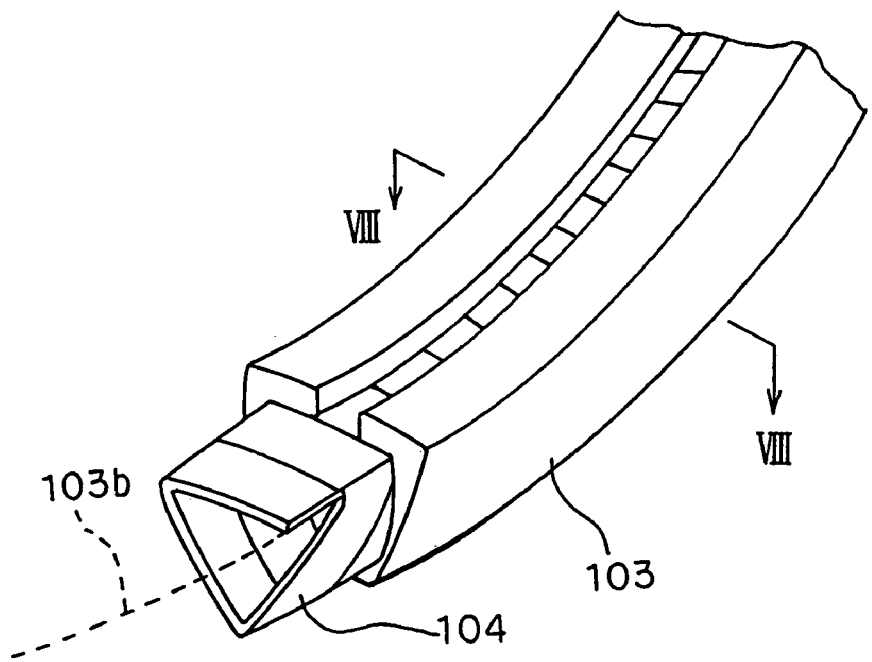
FIG. 7 is an enlarged fragmentary perspective view surrounded by the circle VII of FIG. 6.
Figure 8:
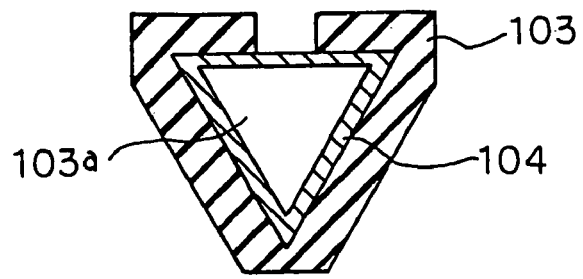
FIG. 8 is a cross-sectional view taken on the line VIII-VIII of FIG. 7.

While each of the first and second seal rings 51 and 52 comprises an annular retaining member 101 and an annular spring member 102 which are shown in FIGS. 3 to 5 in this embodiment, the first and second seal rings 51 and 52 may comprise an annular retaining member 103 and an annular spring member 104 which are shown in FIGS. 6 to 8 in place of the annular retaining member 101 and the annular spring member 102 which are shown in FIGS. 3 to 5 according to the present invention.

As will be seen in FIGS. 6 to 8, each of the first and second seal rings 51 and 52 comprises an annular retaining member 103 formed with an annular groove 103a, and an annular spring member 104 tightly received in the annular groove 103a and retained by the annular retaining member 103 to resiliently bias the annular retaining member 103 to expand radially outwardly.

The annular retaining member 103 is made of a resilient material and the annular spring member 104 is made of a metal. The above-mentioned resilient material includes rubber and synthetic resin mainly containing a polyethylene. The annular spring member 104 is made of a strip in the form of a helical shape. The annular spring member 104 is covered by the annular retaining member 103. Each of the first and second seal rings 51 and 52 has a center axis 103b passing therethrough and is of a triangular cross-section taken on the plane perpendicular to the center axis 103b.

Figure 9:
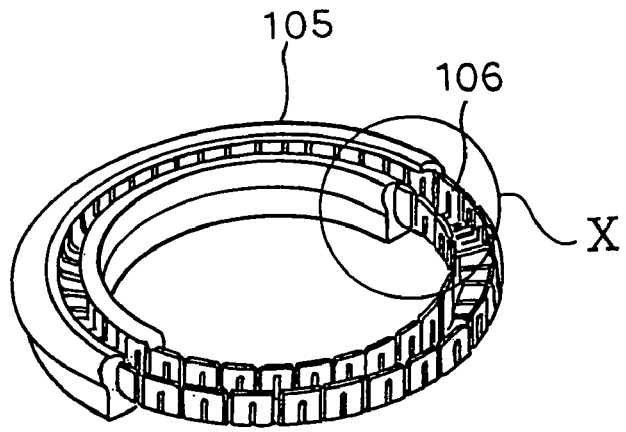
FIG. 9 is a fragmentary perspective view of each of first and second embodiments of the seal rings forming part of the sealing mechanism shown in FIGS. 1 and 12, the seal rings shown in FIG. 9 being positioned closest to the vacuum chamber formed in the semiconductor producing apparatus.
Figure 10:
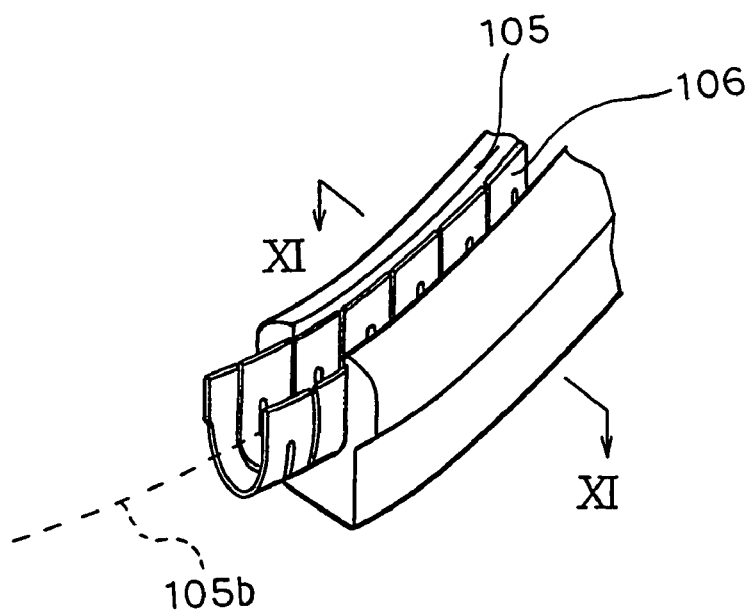
FIG. 10 is an enlarged fragmentary perspective view surrounded by the circle X of FIG. 9.
Figure 11:
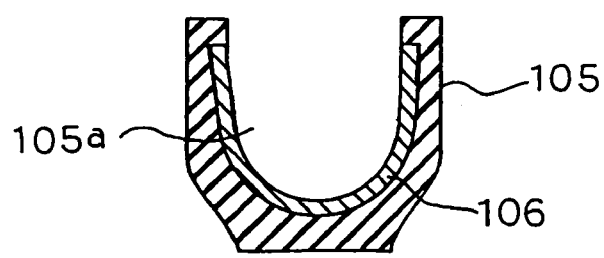
FIG. 11 is a cross-sectional view taken on the line XI-XI of FIG. 10.

As will be seen in FIGS. 9 to 11, the third seal ring 53 comprises an annular retaining member 105 formed with an annular groove 105a, and an annular spring member 106 tightly received in the annular groove 105a and retained by the annular retaining member 105 to resiliently bias the annular retaining member 105 to expand radially outwardly.

The annular retaining member 105 is made of a resilient material and the annular spring member 106 is made of a metal. The above-mentioned resilient material includes rubber and synthetic resin mainly containing a polyethylene. The annular spring member 106 is made of a strip in the form of a helical shape. The annular spring member 106 is covered by the annular retaining member 105. The third seal ring 53 has a center axis 105b passing therethrough and is of a channel-shaped cross-section taken on the plane perpendicular best shown in FIG. 1, the annular groove 105a of third seal ring 53 has an end open toward the second fluid chamber 62.

The operation of the sealing mechanism will be described hereinlater.

The vacuum chamber 11 of the semiconductor producing apparatus is usually controlled to be vacuumized to the pressure level for example at $5 \times 10^{-4}$ Pa while the semiconductor producing apparatus is being operated. At this time, the pressure of the second fluid chamber 62 is maintained at a pressure level substantially equal to that of the vacuum chamber 11. This results in having the pressure $1 \times 10^5$ Pa of the atmosphere 10 and the pressure $5 \times 10^{-4}$ Pa of the vacuum chamber 11 differ from each other at an extremely high level, for example, $1 \times 10^5$-$5 \times 10^{-4}$ Pa. This pressure difference leads to generating an axial force to move the seal rings toward the vacuum chamber 11, with the result that the first, second, and third seal rings 51, 52, and 53 are liable to abruptly be displaced from their respective home positions if external forces such as for example vibrations are generated from other mechanical elements or parts forming the semiconductor producing apparatus. The abrupt displacements of the first, second, and third seal rings 51, 52, and 53 may cause dusts and other foreign materials to enter the vacuum chamber 11 as well as may bring about the pressure fluctuation in the vacuum chamber 11, thereby lessening the productivity of the semiconductor.

In the first embodiment of the sealing mechanism mentioned in the above, there is provided the first and second fluid chambers 61 and 62 axially juxtaposed between the rotation shaft 20 and the support member 40 to overcome the above problems the prior art encounters. The first fluid chamber 61 is sucked through the first fluid passageway 41 by the air sucking unit 70 to be maintained at a pressure lower than the atmospheric pressure but higher than those of the second fluid chamber 62 and the vacuum chamber 11. It is thus to be noted that the dusts and other foreign materials are discharged and sucked through the first fluid passageway 41 by the air sucking unit 70 while the pressure of the first fluid chamber 61 is maintained at its optimum pressure level, i.e., lower than the atmospheric pressure but higher than those of the second fluid chamber 62 and the vacuum chamber 11 to prevent the abrupt pressure drop in the vacuum chamber 11. This function of the first fluid chamber 61 is cooperated with the function of the second fluid chamber 62 to enhance the effectiveness of the sealing mechanism according to the present invention.

From the above description, it will be understood that the first, second, and third seal rings 51, 52, and 53 work together to prevent dusts and other foreign materials from entering the vacuum chamber 11 as well as to prevent the pressure of the vacuum chamber 11 from dropping over its allowable level. More specifically, the first, second, and third seal rings 51, 52, and 53 axially spaced apart from each other to form the first and second fluid chambers 61 and 62 can result in the fact that the dusts and other foreign materials entering the first fluid chamber 61 can be removed through the first fluid passageway 41 by the air sucking unit 70 to prevent the dusts and other foreign materials from entering the second fluid chamber 62 and the vacuum chamber 11 while the pressure of the vacuum chamber 11 is not dropped rapidly due to the first and second fluid chambers 61 and 62 provided between the vacuum chamber 11 and the atmosphere 10.

In a usual manner, the sealing mechanism is operated to have the second seal ring 52 serve as completely sealing between the second seal ring 52 and the support member 40 and between the second seal ring 52 and the rotation shaft 20. Sometimes, there occur vibrations and other mechanical motions of the elements or parts of the semiconductor producing apparatus to impart shocks to the second seal ring 52. When such the vibrations and other mechanical motions of the elements or parts of the semiconductor producing apparatus are generated, the small gaps are formed between the second seal ring 52 and the support member 40 and between the second seal ring 52 and the rotation shaft 20. The small gaps lead to introducing the air in the first fluid chamber 61 into the second fluid chamber 62 because the pressure of the first fluid chamber 61 is always maintained at a level higher than that of the second fluid chamber 62. The air entering the second fluid chamber 62 comes to be equal in pressure to the air in the vacuum chamber 11 by the reason that the second fluid chamber 62 is held in communication with the vacuum chamber 11 through the filter 80. If, at this time, the air introduced into the second fluid chamber 62 happens to contain dusts and other foreign materials, these materials are prevented from entering the vacuum chamber 11 by the filter 80 and by no means fly and scatter in the air of the vacuum chamber 11.

On the other hand, the aforementioned fact that the air entering the second fluid chamber 62 becomes equal in pressure to the air in the vacuum chamber 11 means that the third seal ring 53 between the second fluid chamber 62 and the vacuum chamber 11 does not undergo any pressure, i.e., axial force caused in the second fluid chamber 62 and the vacuum chamber 11, thereby making it possible to completely prevent the air in the second fluid chamber 62 from entering the vacuum chamber 11 through the gap between the third seal ring 53 and the support member 40 and between the third seal ring 53 and the rotation shaft 20. No axial force and pressure imparted on the third seal ring 53 can render the contacting pressure on the support member 40 and the rotation shaft 20 extremely small in value so that no dusts is generated by the friction between the third seal ring 53 and the support member 40 and between the third seal ring 53 and the rotation shaft 20.

Figure 12:
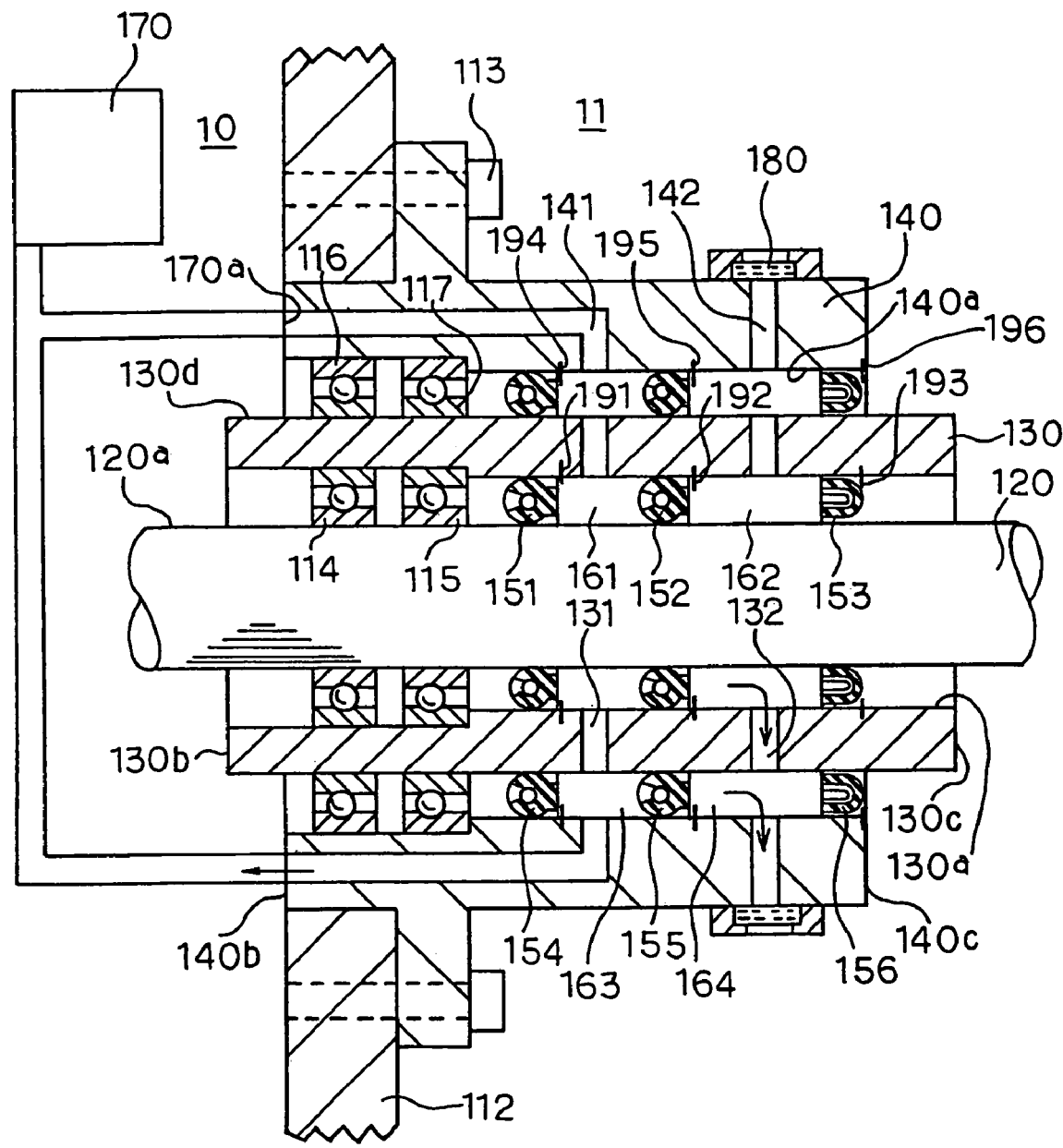
FIG. 12 is a fragmentary cross-sectional view similar to FIG. 1 but showing a second embodiment of the sealing mechanism according to the present invention.
Figure 13:
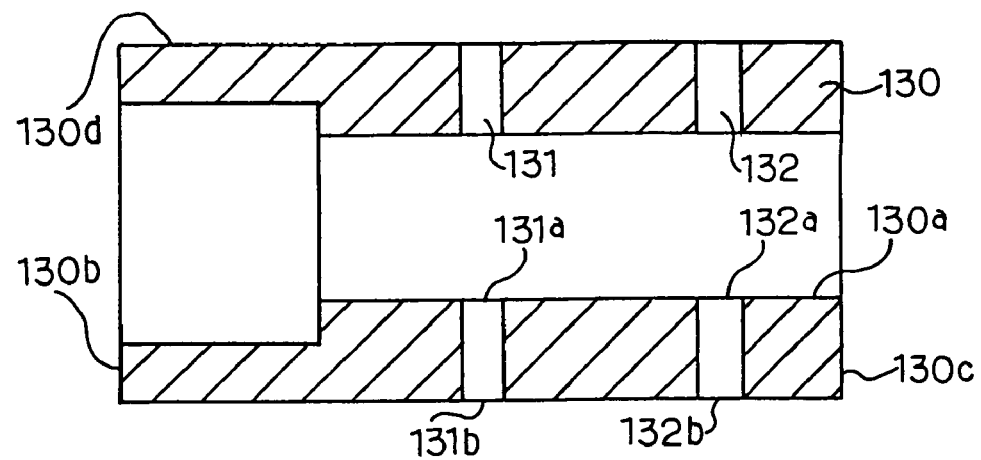
FIG. 13 is an enlarged cross-sectional view of a second rotation shaft forming part of the sealing mechanism shown in FIG. 12.
Figure 14:
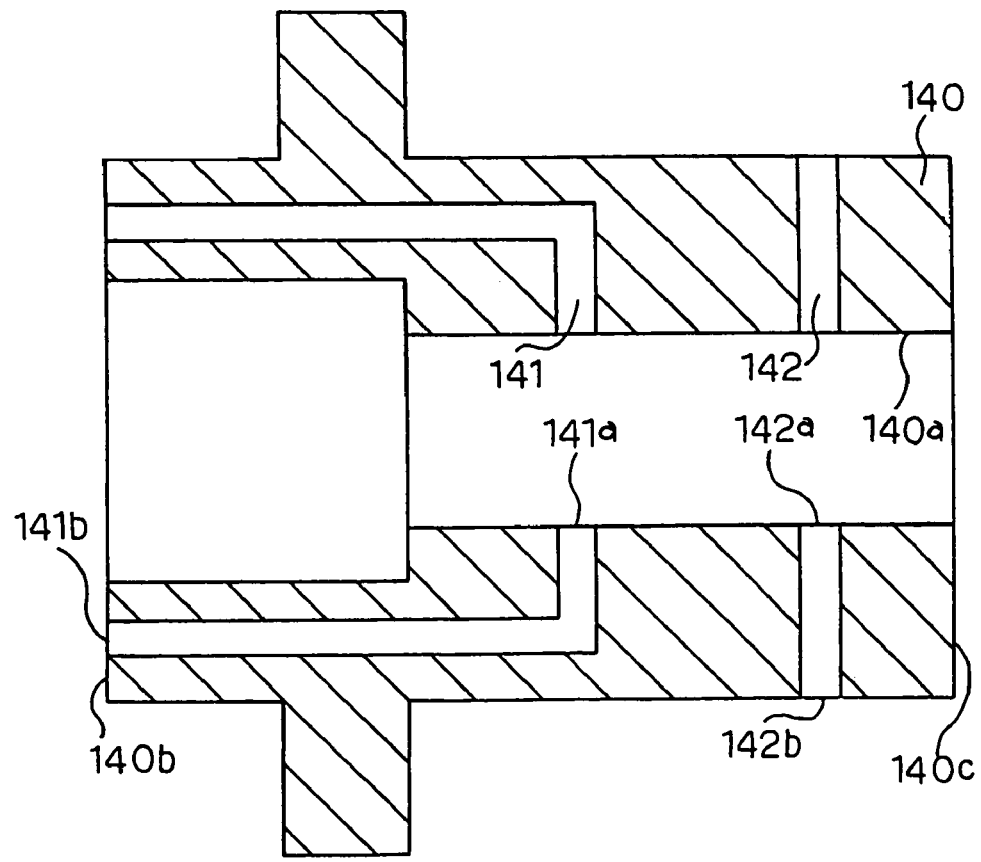
FIG. 14 is an enlarged cross-sectional view of a support member forming part of the sealing mechanism shown in FIG. 12.
Figure 15:
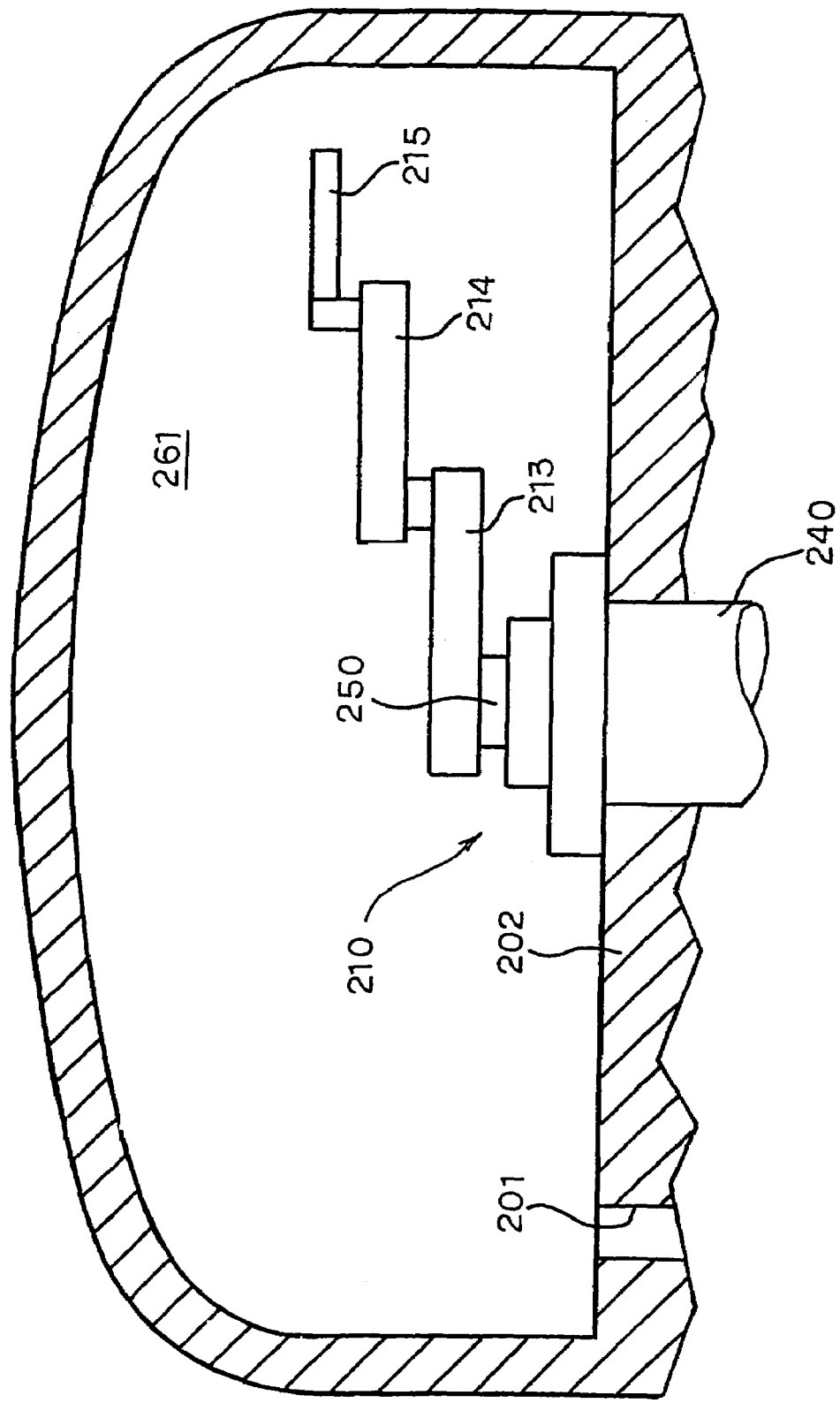
FIG. 15 is a fragmentary cross-sectional view of the conventional semiconductor producing apparatus.
Figure 16:
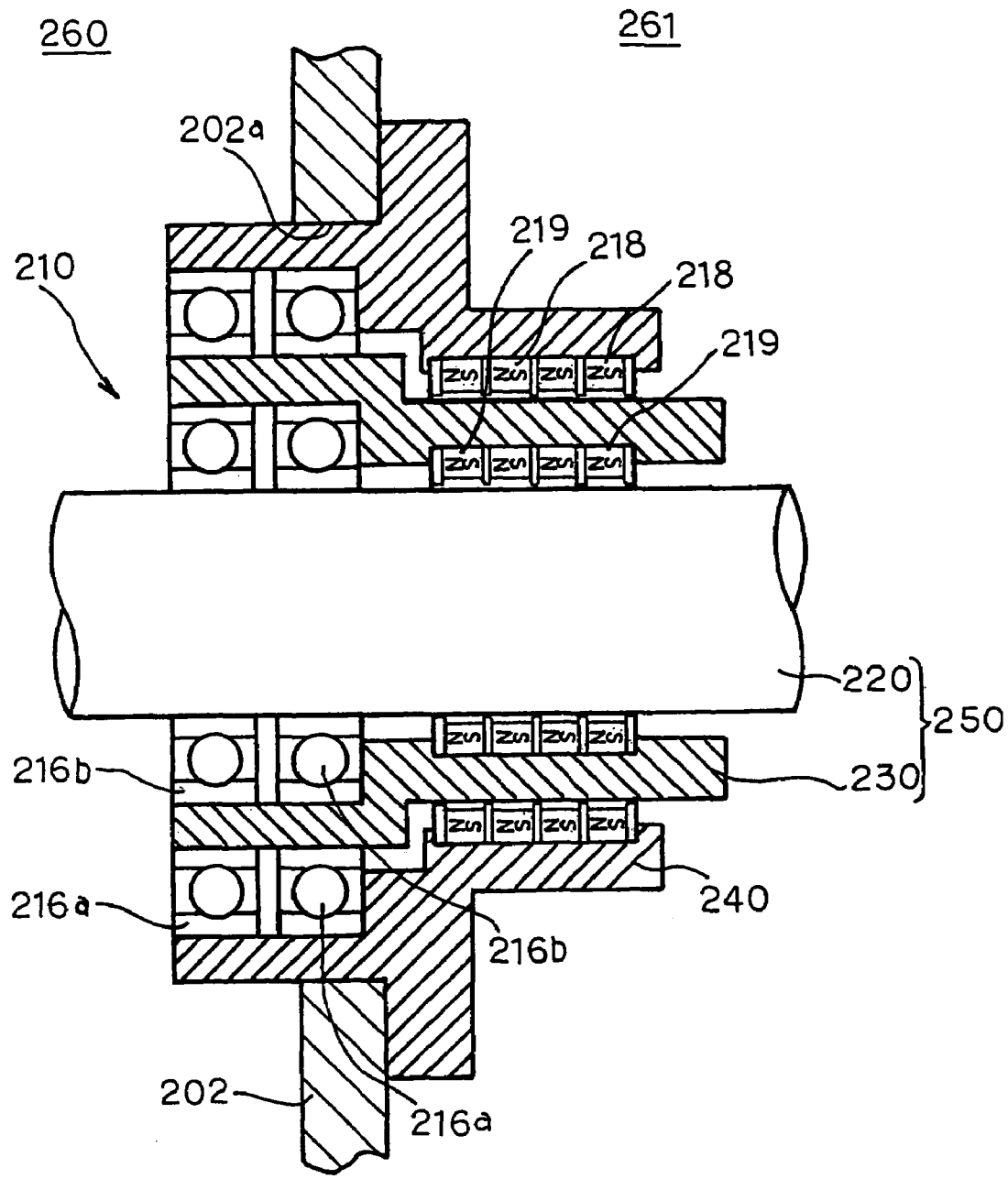
FIG. 16 is a cross-sectional view similar to FIG. 12 but showing a conventional sealing mechanism.

Referring to FIGS. 12 to 14 of the drawings, there is shown a second preferred embodiment of the sealing mechanism according to the present invention. The sealing mechanism is shown in FIGS. 12 to 14 as comprising a first rotation shaft 120 driven to be rotatable around its own axis and having an outer surface 120a in the form of a cylindrical shape.

The sealing mechanism further comprises a second rotation shaft 130 driven to be rotatable around its own axis and rotatably receiving therein the first rotation shaft 120 through two axially spaced bearings 114 and 115. The second rotation shaft 130 has an inner surface 130a in the form of a cylindrical hollow shape, first and second axial ends 130b and 130c respectively extending in the atmosphere 10 and the vacuum chamber 11, and an outer surface 130d in the form of a cylindrical shape. The above-mentioned inner surface 130a of the second rotation shaft 130 is larger in diameter than the outer surface 120a of the first rotation shaft 120. The second rotation shaft 130 is formed with a plurality of first fluid passageways 131 each having first and second ends 131a and 131b respectively open at the inner and outer surface 130a and 130d of the second rotation shaft 130 and a plurality of second fluid passageways 132 each having first and second ends 132a and 132b respectively open at the inner and outer surface 130a and 130d of the second rotation shaft 130.

The sealing mechanism further comprises a support member 140 intervening between the vacuum chamber 11 and the atmosphere 10 and rotatably supporting the second rotation shaft 130 to have the second rotation shaft 130 received therein through two axially spaced bearings 116 and 117. The support member 140 forms part of the semiconductor producing apparatus having the vacuum chamber 11. The semiconductor producing apparatus has a wall 112 partly shown in FIG. 12 and fixed to the support member 140 by bolts 113. The support member 140 has an inner surface 140a in the form of a cylindrical hollow shape and first and second axial ends 140b and 140c respectively extending in the atmosphere 10 and the vacuum chamber 11. The above-mentioned inner surface 140a of the support member 140 is larger in diameter than the outer surface 130d of the second rotation shaft 130. The support member 140 is formed with a plurality of third fluid passageways 141 each having a first end 141a and a second end 141b and a plurality of fourth fluid passageways 142 each having a first end 142a and a second end 142b open toward the vacuum chamber 11.

While there have been described in the above about the fact that the second rotation shaft 130 is formed with the plurality of first fluid passageways 131, the plurality of first fluid passageways 131 may be replaced by a single first fluid passageway 131, according to the present invention. Similarly, the plurality of second fluid passageways 132 may be replaced by a single second fluid passageway 132, and the plurality of third fluid passageways 141 may be replaced by a single third fluid passageway 141, and the plurality of fourth fluid passageways 142 may be replaced by a single fourth fluid passageway 142.

The sealing mechanism further comprises first and second seal rings 151 and 152 positioned between the first and second rotation shafts 120 and 130 in axially spaced-apart relationship with each other to hermetically seal the gap between the first and second rotation shafts 120 and 130 under the state that the first seal ring 151 is located in the neighborhood of the first axial end 130b of the second rotation shaft 130 and remote from the second axial end 130c of the second rotation shaft 130 and that the second seal ring 152 is located in the neighborhood of the second axial end 130c of the second rotation shaft 130 and remote from the first axial end 130b of the second rotation shaft 130. The first and second rotation shafts 120 and 130 and the first and second seal rings 151 and 152 collectively form a first fluid chamber 161 held in communication with the first fluid passageway 131 through the first end 131a of the first fluid passageway 131.

The sealing mechanism further comprises a third seal ring 153 positioned between the first and second rotation shafts 120 and 130 in axially spaced-apart relationship with the second seal ring 152 between the second seal ring 152 and extension plane radially inwardly extending and flush with the second axial end of the second rotation shaft 130 to hermetically seal the gap between first and second rotation shafts 120 and 130. The first and second rotation shafts 120 and 130 and the second and third seal ring 152 and 153 collectively form a second fluid chamber 162 held in communication with the second fluid passageway 132 through the first end 132a of the second fluid passageway 132.

The sealing mechanism further comprises fourth and fifth seal rings 154 and 155 positioned between the second rotation shaft 130 and the support member 140 in axially spaced-apart relationship with each other to hermetically seal the gap between the second rotation shaft 130 and the support member 140 under the state that the fourth seal ring 154 is located in the neighborhood of the first axial end 140b of the support member 140 and remote from the second axial end 140c of the support member 140 and that the fifth seal ring 155 is located in the neighborhood of the second axial end 140c of the support member 140 and remote from the first axial end 140b of the support member 140. The second rotation shaft 130, the support member 140, and the fourth and fifth seal rings 154 and 155 collectively form a third fluid chamber 163 held in communication with the first fluid passageway 131 through the second end 131b of the first fluid passageway 131 and the third fluid passageway 141 through the first end 141a of the third fluid passageway 141.

The sealing mechanism further comprises an air sucking unit 170 having a port 170a held in communication with the second end 141b of the third fluid passageway 141 to maintain the pressure of the third fluid passageway 141 at a level between the atmospheric pressure and the inner pressure of the vacuum chamber 11.

The sealing mechanism further comprises a sixth seal ring 156 positioned between the second rotation shaft 130 and the support member 140 in axially spaced-apart relationship with the fifth seal ring 155 between the fifth seal ring 155 and the extension plane radially inwardly extending and flush with the second axial end 140c of the support member 140 to hermetically seal the gap between the second rotation shaft 130 and the support member 140. The second rotation shaft 130, the support member 140, and the fifth and sixth seal ring 155 and 156 collectively form a fourth fluid chamber 164 held in communication with the second fluid passageway 132 through the second end 132b of the second fluid passageway 132 and the fourth fluid passageway 142 through the first end 142a of the fourth fluid passageway 142.

The sealing mechanism further comprises a fluid filter 180 disposed on the portion of the support member 140 exposed to the vacuum chamber 11 to cover the second end 142b of the fourth fluid passageway 142.

The sealing mechanism further comprises stop means for stopping the first to third seal rings 151, 152, and 153 from moving toward the vacuum chamber 11 with respect to the first and second rotation shafts 120 and 130, and the fourth to sixth seal rings 154, 155, and 156 from moving toward the vacuum chamber 11 with respect to the second rotation shaft 130 and the support member 140. In this embodiment of the sealing mechanism, the stop means is constituted by first to third rings 191, 192, and 193 which are fastened selectively to the first and second rotation shafts 120 and 130 to respectively stop the first to third seal rings 151, 152, and 153 from moving toward the vacuum chamber 11, and fourth to sixth rings 194, 195, and 196 which are fastened selectively to the second rotation shaft 130 and the support member 140 to respectively stop the fourth to sixth seal rings 154, 155, and 156 from moving toward the vacuum chamber 11.

To ensure that the frictions between the first to third seal rings 151, 152, and 153 and the first rotation shaft 120, between the first to third seal rings 151, 152, and 153 and the second rotation shaft 130, between the fourth to sixth seal rings 154, 155, and 156 and the second rotation shaft 130, and between the fourth to sixth seal rings 154, 155, and 156 and the support member 140 are reduced to a minimum level, as a small level as possible, the outer surface 120a of the first rotation shaft 120, the inner surface 130a of the second rotation shaft 130, the outer surface 130d of the second rotation shaft 130, and the inner surface 140a of the support member 140 are coated with a tetrafluoroethylene layer.

As will be seen in FIGS. 3 to 5, each of the first, second, fourth, and fifth seal rings 151, 152, 154, and 155 comprises an annular retaining member 101 formed with an annular groove 101a, and an annular spring member 102 tightly received in the annular groove 101a and retained by the annular retaining member 101 to resiliently bias the annular retaining member 101 to expand radially outwardly.

The annular retaining member 101 is made of a resilient material and the annular spring member 102 is made of a metal. The above-mentioned resilient material includes rubber and synthetic resin mainly containing a polyethylene. The annular spring member 102 is made of a strip in the form of a helical shape. The annular spring member 102 is covered by the annular retaining member 101. Each of the first, second, fourth, and fifth seal rings 151, 152, 154, and 155 has a center axis 101b passing therethrough and is of a circular cross-section taken on the plane perpendicular to the center axis 101b.

While each of the first, second, fourth, and fifth seal rings 151, 152, 154, and 155 comprises an annular retaining member 101 and an annular spring member 102 which are shown in FIGS. 3 to 5 in this embodiment, the first, second, fourth, and fifth seal rings 151, 152, 154, and 155 may comprise an annular retaining member 103 and an annular spring member 104 which are shown in FIGS. 6 to 8 in place of the annular retaining member 101 and the annular spring member 102 which are shown in FIGS. 3 to 5 according to the present invention.

As will be seen in FIGS. 6 to 8, each of the first, second, fourth, and fifth seal rings 151, 152, 154, and 155 comprises an annular retaining member 103 formed with an annular groove 103a, and an annular spring member 104 tightly received in the annular groove 103a and retained by the annular retaining member 103 to resiliently bias the annular retaining member 103 to expand radially outwardly.

The annular retaining member 103 is made of a resilient material and the annular spring member 104 is made of a metal. The above-mentioned resilient material includes rubber and synthetic resin mainly containing a polyethylene. The annular spring member 104 is made of a strip in the form of a helical shape. The annular spring member 104 is covered by the annular retaining member 103. Each of the first, second, fourth, and fifth seal rings 151, 152, 154, and 155 has a center axis 103b passing therethrough and is of a triangular cross-section taken on the plane perpendicular to the center axis 103b.

As will be seen in FIGS. 9 to 11, each of the third and sixth seal rings 153 and 156 comprises an annular retaining member 105 formed with an annular groove 105a, and an annular spring member 106 tightly received in the annular groove 105a and retained by the annular retaining member 105 to resiliently bias the annular retaining member 105 to expand radially outwardly.

The annular retaining member 105 is made of a resilient material and the annular spring member 106 is made of a metal. The above-mentioned resilient material includes rubber and synthetic resin mainly containing a polyethylene. The annular spring member 106 is made of a strip in the form of a helical shape. The annular spring member 106 is covered by the annular retaining member 105. Each of the third and sixth seal rings 153 and 156 has a center axis 105b passing therethrough and is of a channel-shaped cross-section taken on the plane perpendicular to the center axis 105b. As best shown in FIG. 12, the annular groove 105a of third seal ring 153 has an end open toward the second fluid chamber 162 and the annular groove 105a of sixth seal ring 156 has an end open toward the fourth fluid chamber 164.

The operation of the sealing mechanism will be described hereinlater.

The vacuum chamber 11 of the semiconductor producing apparatus is usually controlled to be vacuumized to the pressure level for example at $5 \times 10^{-4}$ Pa while the semiconductor producing apparatus is being operated. At this time, the pressure of the second and fourth fluid chambers 162 and 164 are maintained at a pressure level substantially equal to that of the vacuum chamber 11. This results in having the pressure $1 \times 10^5$ Pa of the atmosphere 10 and the pressure $5 \times 10^{-4}$ Pa of the vacuum chamber 11 differ from each other at an extremely high level, for example, $1 \times 10^5 - 5 \times 10^{-4}$ Pa. This pressure difference leads to generating an axial force to move the seal rings toward the vacuum chamber 11, with the result that the first to sixth seal rings 151 to 156 are liable to abruptly be displaced from their respective home positions if external forces such as for example vibrations are generated from other mechanical elements or parts forming the semiconductor producing apparatus. The abrupt displacements of the first to sixth seal rings 151 to 156 may cause dusts and other foreign materials to enter the vacuum chamber 11 as well as may bring about the pressure fluctuation in the vacuum chamber 11, thereby lessening the productivity of the semiconductor.

In the second embodiment of the sealing mechanism mentioned in the above, there is provided the first and second fluid chambers 161 and 162 axially juxtaposed between the first rotation shaft 120 and the second rotation shaft 130 to overcome the above problems the prior art encounters, and there is provided the third and fourth fluid chambers 163 and 164 axially juxtaposed between the second rotation shaft 130 and the support member 140 to overcome the above problems the prior art encounters. The first and third fluid chambers 161 and 163 are sucked through the third fluid passageway 141 by the air sucking unit 170 to be maintained at a pressure lower than the atmospheric pressure but higher than those of the second and fourth fluid chambers 162 and 164 and the vacuum chamber 11. It is thus to be noted that the dusts and other foreign materials are discharged and sucked through the third fluid passageway 141 by the air sucking unit 170 while the pressure of the first and third vacuum chambers 161 and 163 are maintained at these optimum pressure level, i.e., lower than the atmospheric pressure but higher than those of the second and fourth fluid chambers 162 and 164 and the vacuum chamber 11 to prevent the abrupt pressure drop in the vacuum chamber 11. This function of the first and third fluid chambers 161 and 163 are cooperated with the function of the second and fourth fluid chambers 162 and 164 to enhance the effectiveness of the sealing mechanism according to the present invention.

From the above description, it will be understood that the first to sixth seal rings 151 to 156 work together to prevent dusts and other foreign materials from entering the vacuum chamber 11 as well as to prevent the pressure of the vacuum chamber 11 from dropping over its allowable level. More specifically, the first, second, and third seal rings 151, 152, and 153 axially spaced apart from each other to form the first and second fluid chambers 161 and 162 can result in the fact that the dusts and other foreign materials entering the first fluid chamber 161 can be removed through the first fluid passageway 131 by the air sucking unit 170 to prevent the dusts and other foreign materials from entering the second fluid chamber 162 and the vacuum chamber 11 while the pressure of the vacuum chamber 11 is not dropped rapidly due to the first and second fluid chambers 161 and 162 provided between the vacuum chamber 11 and the atmosphere 10. The fourth, fifth, and sixth seal rings 154, 155, and 156 axially spaced apart from each other to form the third and fourth fluid chambers 163 and 164 can result in the fact that the dusts and other foreign materials entering the third fluid chamber 163 can be removed through the third fluid passageway 141 by the air sucking unit 170 to prevent the dusts and other foreign materials from entering the fourth fluid chamber 164 and the vacuum chamber 11 while the pressure of the vacuum chamber 11 is not dropped rapidly due to the third and fourth fluid chambers 163 and 164 provided between the vacuum chamber 11 and the atmosphere 10.

In a usual manner, the sealing mechanism is operated to have the second seal ring 152 serve as completely sealing between the second seal ring 152 and the second rotation shaft 130 and between the second seal ring 152 and the first rotation shaft 120, and to have the fifth seal ring 155 serve as completely sealing between the fifth seal ring 155 and the support member 140 and between the fifth seal ring 155 and the second rotation shaft 130. Sometimes, there occur vibrations and other mechanical motions of the elements or parts of the semiconductor producing apparatus to impart shocks to the second and fifth seal rings 152 and 155. When such the vibrations and other mechanical motions of the elements or parts of the semiconductor producing apparatus are generated, the small gaps are formed between the second seal ring 152 and the second rotation shaft 130, between the second seal ring 152 and the first rotation shaft 120, between the fifth seal ring 155 and the support member 140, and between the fifth seal ring 155 and the second rotation shaft 130. The small gaps between the second seal ring 152 and the second rotation shaft 130 and between the second seal ring 152 and the first rotation shaft 120 lead to introducing the air in the first fluid chamber 161 into the second fluid chamber 162 because the pressure of the first fluid chamber 161 is always maintained at a level higher than that of the second fluid chamber 162. The small gaps between the fifth seal ring 155 and the support member 140 and between the fifth seal ring 155 and the second rotation shaft 130 lead to introducing the air in the third fluid chamber 163 into the fourth fluid chamber 164 because the pressure of the third fluid chamber 163 is always maintained at a level higher than that of the fourth fluid chamber 164. The air entering the second and fourth fluid chambers 162 and 164 comes to be equal in pressure to the air in the vacuum chamber 11 by the reason that the second and fourth fluid chambers 162 and 164 are held in communication with the vacuum chamber 11 through the filter 180. If, at this time, the air introduced into the second and fourth fluid chambers 162 and 164 happen to contain dusts and other foreign materials, these materials are prevented from entering the vacuum chamber 11 by the filter 180 and by no means fly and scatter in the air of the vacuum chamber 11.

On the other hand, the aforementioned fact that the air entering the second fluid chamber 162 becomes equal in pressure to the air in the vacuum chamber 11 means that the third seal ring 153 between the second fluid chamber 162 and the vacuum chamber 11 does not undergo any pressure, i.e., axial force caused in the second fluid chamber 162 and the vacuum chamber 11, thereby making it possible to completely prevent the air in the second fluid chamber 162 from entering the vacuum chamber 11 through the gap between the third seal ring 153 and the second rotation shaft 130 and between the third seal ring 153 and the first rotation shaft 120. The aforementioned fact that the air entering the fourth fluid chamber 164 becomes equal in pressure to the air in the vacuum chamber 11 means that the sixth seal ring 156 between the fourth fluid chamber 164 and the vacuum chamber 11 does not undergo any pressure, i.e., axial force caused in the fourth fluid chamber 164 and the vacuum chamber 11, thereby making it possible to completely prevent the air in the fourth fluid chamber 164 from entering the vacuum chamber 11 through the gap between the sixth seal ring 156 and the support member 140 and between the sixth seal ring 156 and the second rotation shaft 130. No axial force and pressure imparted on the third seal ring 153 can render the contacting pressure on the second rotation shaft 130 and the first rotation shaft 120 extremely small in value so that no dusts is generated by the friction between the third seal ring 153 and the second rotation shaft 130 and between the third seal ring 153 and the first rotation shaft 120. No axial force and pressure imparted on the sixth seal ring 156 can render the contacting pressure on the support member 140 and the second rotation shaft 130 extremely small in value so that no dusts is generated by the friction between the sixth seal ring 156 and the support member 140 and between the sixth seal ring 156 and the second rotation shaft 130.

According to the present invention, the circular cross-sectioned seal ring shown in FIGS. 3 to 5 or the triangular cross-sectioned seal ring shown in FIGS. 6 to 8 can be used for the first and second seal rings 51 and 52 in the first embodiment of the seal mechanism shown in FIGS. 1 and 2 and the first, second, fourth, and fifth seal rings 151, 152, 154, and 155 in the second embodiment of the seal mechanism shown in FIGS. 12 to 14. In general, the circular cross-sectioned seal ring is larger in spring constant than the triangular cross-sectioned seal ring. This means that the surface pressure of the circular cross-sectioned seal ring is larger than that of the triangular cross-sectioned seal ring and that the circular cross-sectioned seal ring is more easily worn than the triangular cross-sectioned seal ring. The abrasion ratio of the triangular cross-sectioned seal ring is smaller than that of the circular cross-sectioned seal ring, thereby making it possible for the triangular cross-sectioned seal ring to withstand longer than that of the circular cross-sectioned seal ring. Moreover, the surface pressure of the triangular cross-sectioned seal ring can be reduced to the extent smaller than that of the circular cross-sectioned seal ring for a given time period. From this reason, the triangular cross-sectioned seal ring can withstand for a longer period than that of the circular cross-sectioned seal ring. In view of the characteristics of the triangular cross-sectioned seal ring and the circular cross-sectioned seal ring, it is preferable that the seal ring mechanism be designed and produced.

While the subject invention has been described with relation to the preferred embodiments, various modifications and adaptations thereof will now be apparent to those skilled in the art as far as such modifications and adaptations fall within the scope of the appended claims intended to be covered thereby.

What is claimed is:

1. A sealing mechanism for sealing a vacuum chamber, comprising:
a first member having an outer surface in the form of a cylindrical shape and extending in the atmosphere and said vacuum chamber;
a second member having said first member received therein with a gap and extending in said atmosphere and said vacuum chamber;
a seal ring positioned in said gap between said first member and said second member to hermetically seal the axially inside thereof in said gap from said atmosphere;
stop means for stopping said seal ring from moving toward said vacuum chamber with respect to said first member and said second member; and
a bearing positioned in said gap between said first member and said second member axially outside of said seal ring to be in said atmosphere, said first member being rotatably received in said second member through said bearing;
said seal ring comprising a retaining member formed with a groove opening toward said atmosphere, and a spring member tightly received in said groove and retained by said retaining member to resiliently radially bias said retaining member, and said stop means being constituted by a stop ring fastened selectively to said first member and said second member.

2. A sealing mechanism as set forth in claim 1, in which said first member is a rotatable shaft while said second member is a fixed support member.

3. A sealing mechanism as set forth in claim 2, in which said vacuum chamber is formed in a semiconductor producing apparatus including a robot arm, and said first member is a drive shaft driven to rotate said robot arm, said first member having a forward end portion extending in said vacuum chamber and drivably connected to said robot arm.

4. A sealing mechanism as set forth in claim 1, in which one of said outer surface of said first member and the inner surface of said second member is coated with a tetrafluoroethylene layer to reduce friction between said first member and said seal ring.

5. A sealing mechanism as set forth in claim 1, in which the pressure of said vacuum chamber axially inside of said seal ring is varied in the range of approximately $1\times10^5$ Pa to $5\times10^4$ Pa while the pressure of the atmosphere axially outside of said seal ring is approximately $1\times10^5$ Pa.

6. A sealing mechanism for sealing a vacuum chamber, comprising:
a first member having an outer surface in the form of a cylindrical shape and extending in the atmosphere and said vacuum chamber;
a second member having said first member received therein with a gap and extending in said atmosphere and said vacuum chamber,
a seal ring positioned in said gap between said first member and said second member to hermetically seal the axially inside thereof in said gap from said atmosphere; and
a bearing positioned in said gap between said first member and said second member axially outside of said seal ring to be in said atmosphere, said first member being rotatably received in said second member through said bearing,
said seal ring comprising a retaining member formed with a groove opening toward said atmosphere and a spring member tightly received in said groove and retained by said retaining member to resiliently radially bias said retaining member,
said sealing mechanism, further comprising:
a third member having said second member received therein with an additional gap and extending in said atmosphere and said vacuum chamber;
an additional seal ring positioned in said additional gap between said third member and said second member to hermetically seal the axially inside thereof in said additional gap from said atmosphere; and an additional bearing positioned in said gap between said third member and said second member axially outside of said additional seal ring to be in the atmosphere, said second member being rotatably received in said third member through said additional bearing, said additional seal ring comprising an additional retaining member formed with a groove opening toward said atmosphere, and an additional spring member tightly received in said groove and retained by said retaining member to resiliently radially bias said retaining member.

7. A sealing mechanism as set forth in claim 6, in which each of said first member and said second member is a rotatable shaft while said third member is a fixed support member.

8. A sealing mechanism as set forth in claim 6, in which said vacuum chamber is formed in a semiconductor producing apparatus including a robot arm, and at least one of said first member and said second member is a drive shaft driven to rotate said robot arm, said drive shaft having a forward end portion extending in said vacuum chamber and drivably connected to said robot arm.

9. A sealing mechanism as set forth in claim 6, which further comprises stop means for stopping said seal ring and said additional seal ring from moving toward said vacuum chamber with respect to said first member and said second member.

10. A sealing mechanism as set forth in claim 9, in which said stop means is constituted by a plurality of stop rings each fastened selectively to said second member and said third member.

11. A sealing mechanism as set forth in claim 6, in which one of said outer surface of said first member and the inner surface of said second member is coated with a tetrafluoroethylene layer to reduce friction between said seal ring and one of said first member and said second member.

12. A sealing mechanism as set forth in claim 6, in which one of said outer surface of said second member and the inner surface of said third member is coated with a tetrafluoroethylene layer to reduce friction between said additional seal ring and one of said second member and said third member.

13. A sealing mechanism as set forth in claim 6, in which the pressure of said vacuum chamber axially inside of said seal ring and said additional seal ring is varied in the range of approximately $1 \times 10^5$ Pa to $5 \times 10^{-4}$ Pa while the pressure of the atmosphere axially outside of said seal ring and said additional seal ring is approximately $1 \times 10^5$ Pa.

* * * * *